United States Patent [19]

Teich et al.

[11] Patent Number: 4,850,040

[45] Date of Patent: Jul. 18, 1989

[54] INFRARED REMOTE CONTROL SYSTEM FOR ACTIVATING AND DEACTIVATING ONE OR MORE DEVICES IN A SINGLE ENCLOSED SPACE

[75] Inventors: Rudor M. Teich, South Orange, N.J.; Duane Buckingham, Old Lyme, Conn.

[73] Assignee: Inncom International, Inc., Old Lyme, Conn.

[21] Appl. No.: 68,459

[22] Filed: Jul. 1, 1987

[51] Int. Cl.$^4$ ............................................. H04B 9/00
[52] U.S. Cl. .................................................... 455/603
[58] Field of Search ............... 455/601, 603, 606, 607, 455/608, 617, 618, 619

[56] References Cited

U.S. PATENT DOCUMENTS

| | | | |
|---|---|---|---|
| 4,402,090 | 8/1983 | Gfeller et al. | 455/601 |
| 4,673,911 | 6/1987 | Yoshida | 455/603 |
| 4,706,412 | 11/1987 | Seymour et al. | 455/603 |
| 4,717,913 | 1/1988 | Elcar | 455/601 |

FOREIGN PATENT DOCUMENTS 2019167 10/1979 United Kingdom ............... 455/601

*Primary Examiner*—Robert L. Griffin
*Assistant Examiner*—Leslie Von Beck
*Attorney, Agent, or Firm*—Gottlieb, Rackman & Reisman

[57] ABSTRACT

An infrared remote control system for allowing a console to control the operation of a plurality of remote devices all situated in the same substantially enclosed space, for example, a hotel room. The console includes several simultaneously-operated infrared transmitters, the transmitters being aimed in different directions. Remote devices respond to respective codes, but some also retransmit received radiation so that the console can gain access even to remote devices which are not along a line of sight.

69 Claims, 5 Drawing Sheets

INFRARED REMOTE CONTROL SYSTEM FOR ACTIVATING AND DEACTIVATING ONE OR MORE DEVICES IN A SINGLE ENCLOSED SPACE

This invention relates to infrared (IR) remote control systems, and more particularly to an arrangement in which a single console can control a plurality of remote devices all situated in a hotel room or some other substantially enclosed space.

BACKGROUND OF THE INVENTION

There are many examples of remote control systems which have become commonplace in our times, for television sets, video cassette recorders, hi-fi equipments, lights, etc. There are already being marketed systems which allow the various transmission functions to be combined in a single unit. An unresolved problem, however, is how to insure that the infrared transmission reaches all of the remote units which are to be controlled by the single transmitter.

An example is a hotel room in which a guest might be provided with a central console, typically on a night table between two beds, or on a table which is next to at least a single bed. That console might include a phone, a clock, a radio, remote controls for a television receiver, remote controls for lights, remote controls for air conditioning, etc. The provision of a single console which could control all of these functions and others, with remote control being facilitated by infrared transmission, would simplify system installation. This is especially true in retrofit applications where it is highly desirable to avoid the need to rewire a room. The basic problem, however, is that conventional infrared transmitters generally transmit in a relatively well-defined direction. In an ordinary hotel room, it is not possible to position all of the remote devices which are to be controlled along the same line of sight. There are often light switches, for example, which are near the entrance and which cannot even be seen from the bed. Moreover, it would be highly advantageous to provide a console which could swivel on its base so that it could be moved by a guest as he sits on his bed, for example, while calling room service or making a telephone call; in case the guest does not return the console to its original position, the direction of the infrared transmission might change drastically.

BRIEF DESCRIPTION OF THE INVENTION

It is therefore an object of the present invention to provide an infrared remote control system which allows a console to control the operations of a plurality of remote devices all situated in the same substantially enclosed space.

In accordance with the principles of our invention, the console is designed to radiate commands in many directions. At least two light-emitting-diodes (LEDs) are provided. When the console is in its normal orientation, one LED is aimed backwardly at an angle toward a vertical wall disposed to the rear of the console. Another LED radiates forwardly. In general, the axes of these two transmitters should be separated by at least 90 degrees. In order to insure that the commands are radiated in all directions, it is also highly desirable to provide another two LEDs, both aimed forwardly and upwardly (toward the ceiling) but to opposite sides of the console. The four transmitting devices are operated simultaneously and we have found that this arrangement provides adequate operation even if the console is turned on its base in either direction by as much as 70 degrees, swiveling by at least 45 degrees in either direction being a practical minimum limit for user satisfaction.

However, there may be remote devices which are difficult to access. We therefore also provide in the system a plurality of active infrared repeaters. Some of the remote devices may simply recognize their respective codes and implement their respective functions when accessed. But others of the remote devices are designed to retransmit a received code; these devices may or may not also control respective functions although in most cases they do. A remote unit which functions as a repeater should not simply retransmit the code in the same direction in which it was received because the repeaters should transmit the code in new directions in which the console cannot transmit (even in new directions in which an intermediate relaying repeater could not transmit). In the preferred embodiment of the invention, each remote device which functions to retransmit a received code has a receiving semiconductor device and two, not one, transmitters. Were the axis of the receiver and the axis of a transmitter in line with each other, they would be separated by 180 degrees and the transmission would simply be extended in the same direction. In order to insure that the code is retransmitted in different directions, the receive axis and the transmit axis of at least one of the transmitting LED devices in the remote unit should be separated by less than 90 degrees.

In principle, if enough remote devices are provided, and given the fact that the console will usually initially transmit radiation sufficient to access all remote devices at least along line-of-sights, those remote devices can bend the effective transmission paths sufficiently so that the same console can control all of the remote devices in the same substantially enclosed space. However, there are complications. There are IR repeaters in the prior art. Examples are disclosed in U.S. Pat. Nos. 4,187,421; 4,509,211 and 4,392,022. But the prior art repeaters simply extend transmission in the same or a different direction. In our invention, the object is to bathe an enclosed region with IR radiation so that all remote devices can be controlled, no matter where situated relative to the console. This gives rise to two problems.

The first is that of feedback oscillations. A remote unit retransmits the radiation. A particular remote unit, therefore, can not only retransmit radiation, but it can receive it from another remote unit to which it might have even transmitted it in the first place, or it might even receive transmission from itself. Once started, the retransmission never ceases because the remote units, as a group, may end up operating as one big oscillator.

The solution to this problem is to provide a gating mechanism for the transmitter in each remote unit. In the illustrative embodiment of the invention, the console transmits six-pulse codes. The first pulse is a start pulse, and the code itself consists of five bits or pulses. Each bit has a value which is a function of the time between successive pulses. Each pulse has a width of about twenty microseconds, and follows the preceding pulse by at least one millisecond. Whenever a remote unit detects a pulse, it enables its transmitter for only about thirty microseconds. (The actual transmission requires about twenty microseconds, and a margin of safety is thus provided.) Each transmitter then remains cut off for at least 100 microseconds. The net result is that within a few microseconds all of the remote devices are retransmitting pulses, and they are all cut off from operating after about thirty microseconds. By the time they are all enabled once again, the console is no longer transmitting. In this manner, feedback oscillations are prevented, and whenever the console transmits a pulse there is infrared radiation permeating the enclosed space for about thirty microseconds.

Another vexing problem is that introduced by random noise. Each remote device includes an amplifier and an AGC circuit. Low-level signals are amplified. Initially the amplifier sensitivity can be high so that low-level signals are picked up, with the AGC circuit reducing the sensitivity as the received signal increases in intensity with the various remote devices starting to retransmit. If a single remote device picks up random noise, it will be amplified and retransmitted. This would soon lead to all of the remote units retransmitting the noise. The problem is not that the remote units will respond incorrectly because it is highly unlikely that random noise will give rise to a legitimate six-pulse code which can be recognized by any of the remote devices. The problem is that the AGC circuit in each remote device decreases its sensitivity as random noise is being amplified, with the result being that legitimate signals may not be sensed.

The solution to this problem is that each remote unit is allowed to retransmit only after a valid code is first detected. An ordinary infrared transmitter, such as the type used to control a television receiver, transmits a multi-pulse code repetitively. Each remote device of our invention is designed so that it must first recognize a legitimate complete code—one of the codes for certain remote devices, not necessarily its own—before the retransmit circuitry is enabled. Only after a valid code is recognized can the retransmit circuitry operate. Random noise may affect the receiver of an individual remote unit, but it cannot trigger the entire system because that remote unit does not retransmit.

BRIEF DESCRIPTION OF THE DRAWINGS

Further objects, features and advantages of our invention will become apparent upon consideration of the following detailed description in conjunction with the drawing in which.

DETAILED DESCRIPTION OF THE INVENTION

Figure 1:
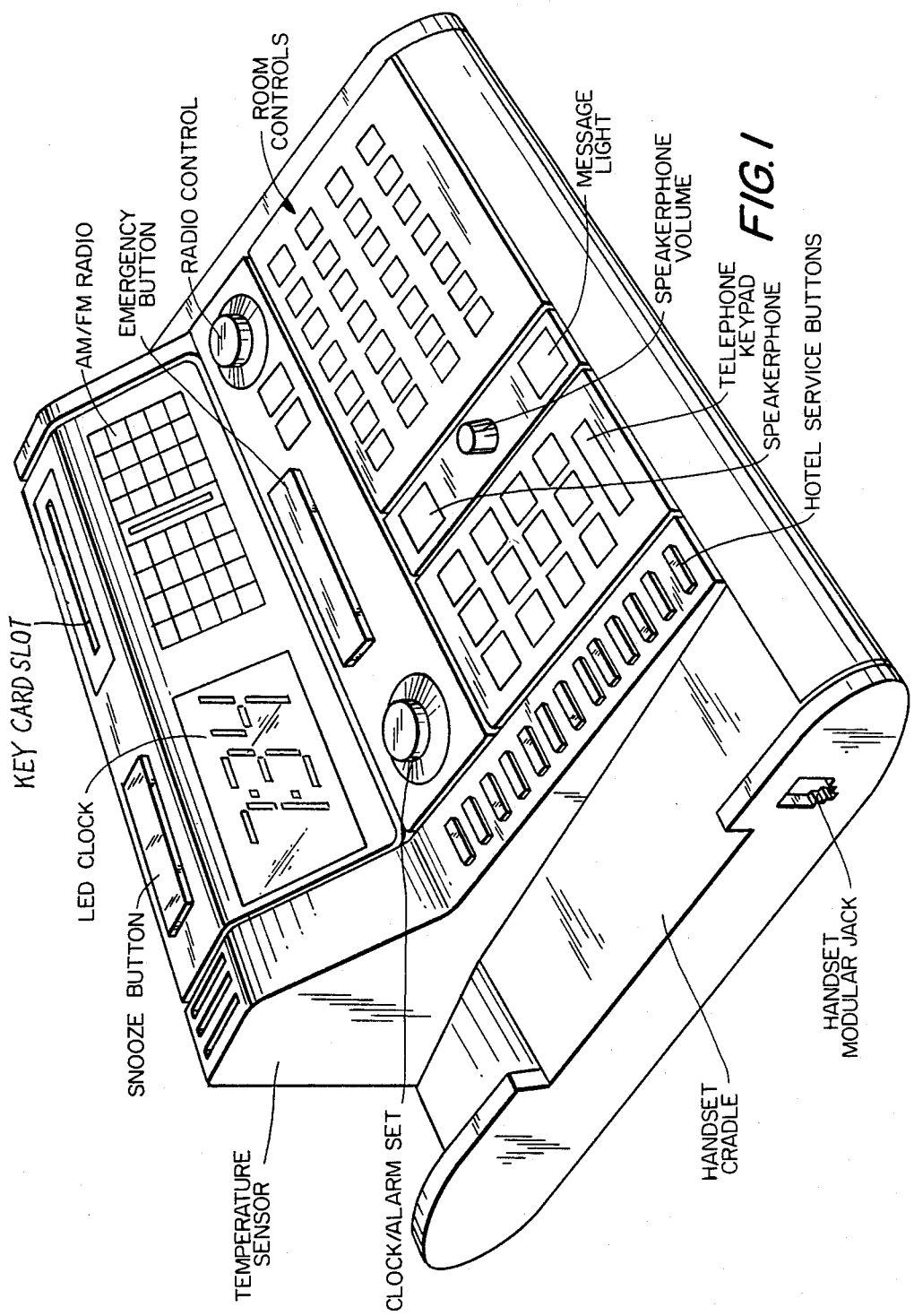
FIG. 1 is a pictorial representation of the kind of console with which our invention can be utilized.

The console can take any of many forms, and FIG. 1 is a rendering of just one possibility. (The telephone handset is not shown, it being understood that the cord plugs into the handset modular jack, with the handset resting in the cradle.) The functions of the various controls depicted on FIG. 1 are evident, except perhaps for the key card slot. It is already commonplace to provide hotel keys in the form of cards. It has been proposed that in order to control the air conditioning in a room, the occupant be required to put his key card in a slot in the central console. In the absence of the card in the slot, the console will transmit an "off" command to the air conditioning units. The advantage of such an approach is that upon removal of the key card when the occupant leaves the room, the console will be able to transmit automatically a command to turn off the air conditioning. In any event, the actual functions controlled by the console are not important to an understanding of the present invention. In fact, not even the coding of the transmission is important. Those skilled in the art know how to effect the transmission of different codes for different functions, under control of respective keys on the console.

Figure 2:
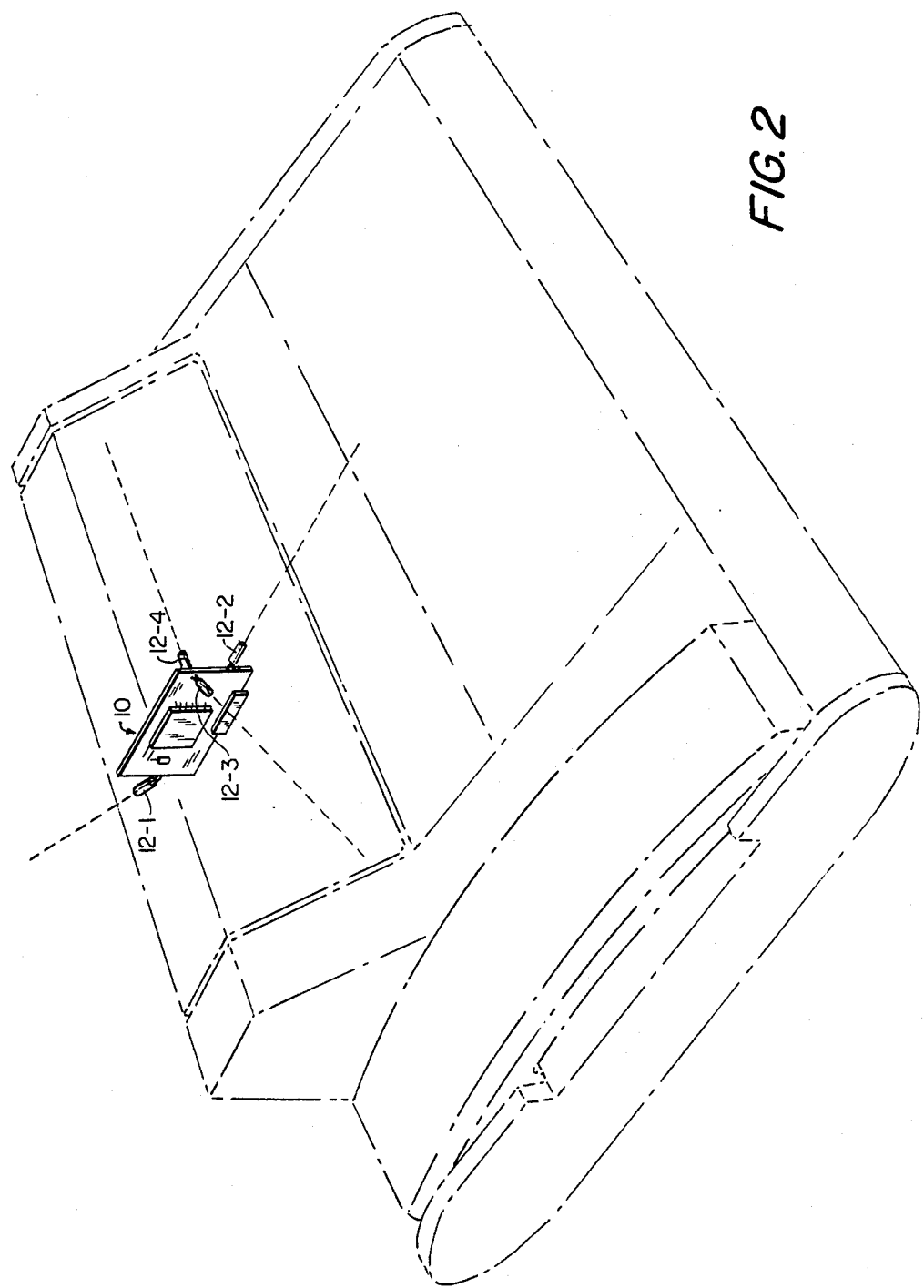
FIG. 2 depicts the positions within the console of the four LED transmitters in the preferred embodiment of our invention.

FIG. 2 depicts a circuit card 10 disposed within the console, the circuit card having transmitting circuitry controlled by the keys on the console. Four light emitting diodes 12-1 through 12-4 are mounted on the card as shown. The four diodes are operated simultaneously. (Typically, there might be two series circuits each having two diodes in it, with the two series circuits being operated in parallel.) In normal use, there will be a vertical wall to the rear of the console. The rear diode 12-1 faces upwardly at an angle of 45 degrees, and its radiation bounces off the rear wall and the ceiling. Diode 12-2 is directed forwardly; preferably, its axis is parallel with the floor, although it too can be angled upwardly. The two additional diodes 12-3 and 12-4 are aimed at opposite sides, each making a 60 degree angle with the vertical plane which contains the circuit board 10. Each of diodes 12-3 and 12-4 also makes a 30 degree angle with a horizontal plane. We have found that with four diodes arranged as shown in FIG. 2, radiation will be diffused throughout a substantially enclosed space such as that represented by most hotel rooms; in fact, the console can swivel by at least 45 degrees in either direction and still control all of the remote devices. To accomplish this, at least the forward facing and the rearwardly facing light emitting diodes are necessary. Preferably the console can be turned on its base by as much as 70 degrees in either direction; this generally requires the use of the two additional light emitting diodes on the sides.

Figure 4:
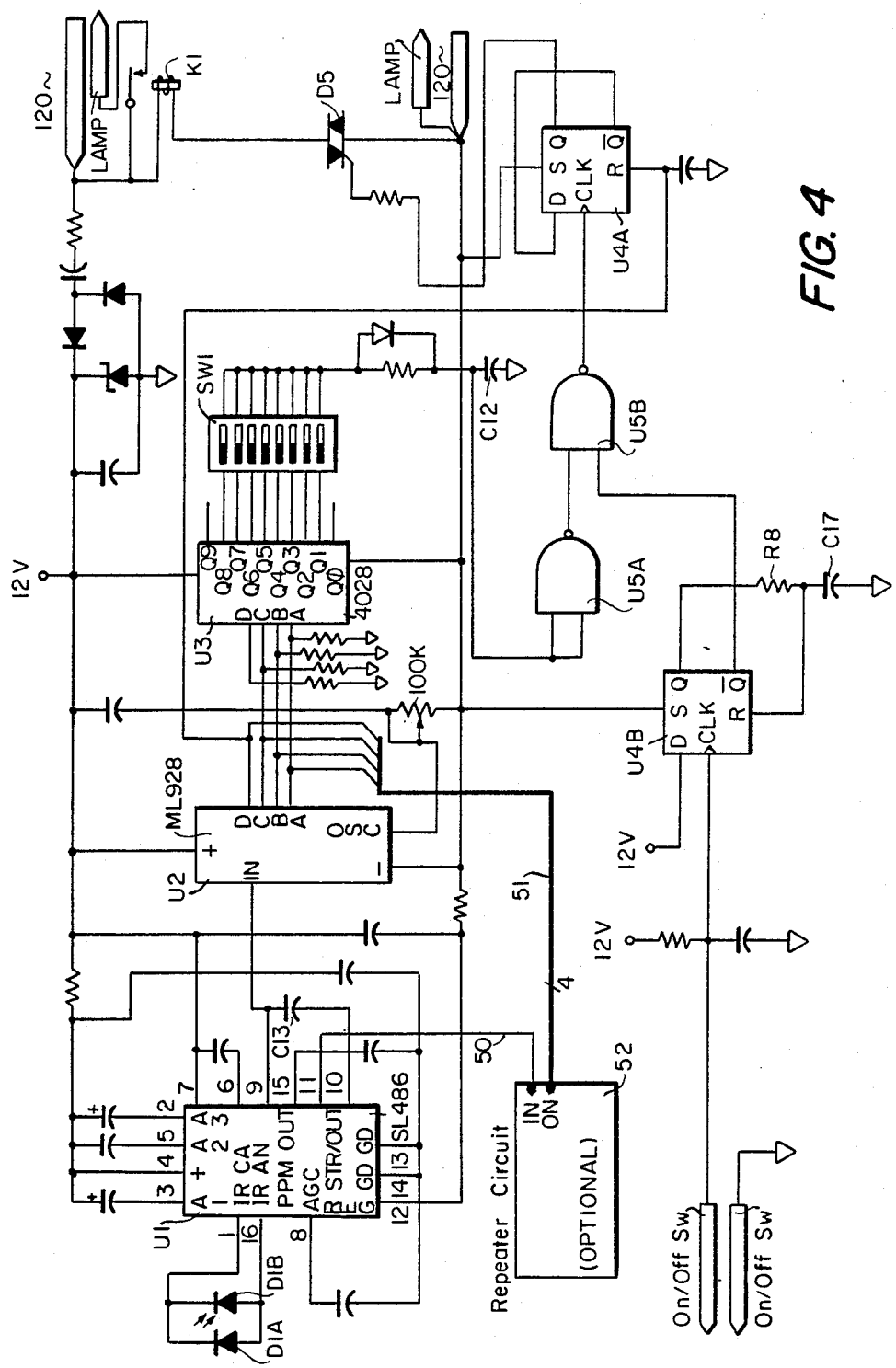
FIG. 4 is a schematic of a remote unit of our invention.

The circuitry for deriving the code which is transmitted is not shown in the drawing other than as being included on circuit board 10 in FIG. 2. The IR coding system which is preferred is an off-the-shelf system originally designed for the control of television receivers, integrated circuits for such a system being manufactured by Plessey Semiconductor (although there is no reason to believe that the systems of other manufacturers will be any less efficacious). The Plessey method of modulation is that of pulse position. Six narrow pulses, each being approximately twenty microseconds in width, are transmitted a few milliseconds apart. The first pulse is a start pulse. The value of each of the five bits in the transmission depends upon the separation between successive pulses. The five-bit code can represent up to thirty-two commands. The advantage of the modulation scheme is that the IR pulses are high in peak power, but the average power is kept low. The Plessey receiver subsystem includes a special front-end amplifier (SL486) and a decoder (ML928). These integrated circuits are shown in FIG. 4. A single integrated circuit provides the time base functions and the encoding to convert keyboard switch closures into IR signals; this integrated circuit (SL490) would be included on circuit board 10 in FIG. 2.

Infrared radiation travels in a straight line. Even with the use of four diodes in the console, it is usually not feasible to control all of the remote units in a hotel room, and this is especially true if there are people in the room who can block the transmission paths, and if the console is to swivel an appreciable amount in either direction so that access may be had to it from a bed on either side. There may be cases in which repeaters are not required, but we have found that for maximum reliability repeaters are often necessary. Unlike conventional repeaters of many kinds in which the transmission is to travel in a straight line, the purpose of the console of our invention is to diffuse an enclosed space sufficiently with radiation such that all remote devices can be accessed.

Figure 3:
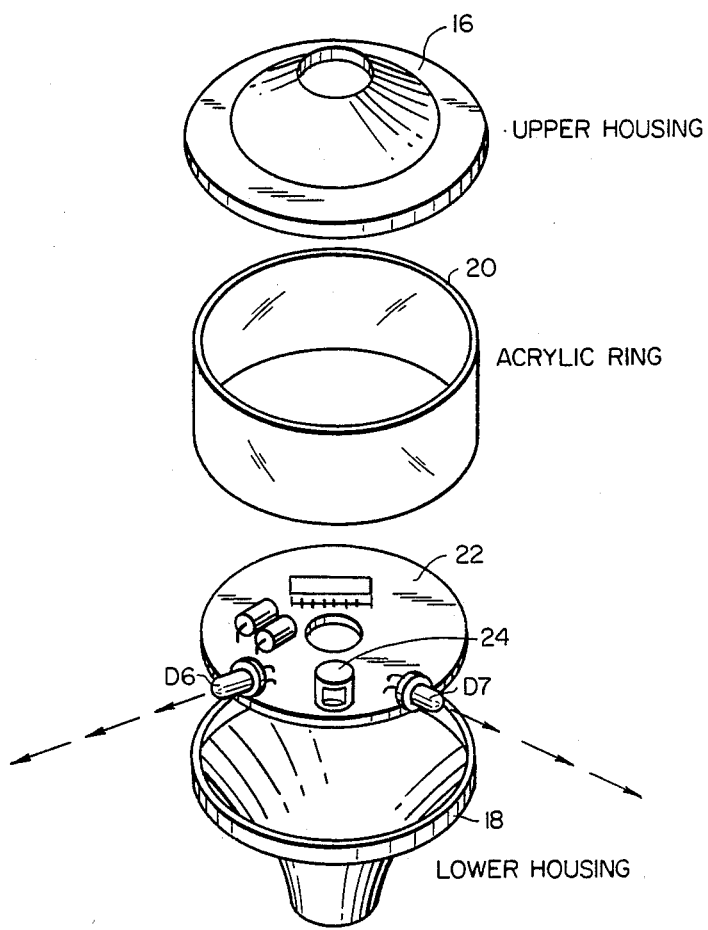
FIG. 3 depicts the physical construction of a remote unit used in the system of our invention.

A preferred form of repeater is shown in FIG. 3. It is designed for mounting on the pole of a lamp. Although referred to as a repeater, the device also decodes received transmission and responds to receipt of an appropriate code for operating the associated device, in this case a lamp. The repeater includes upper and lower housings 16 and 18, an acrylic ring 20 (for asthetic purposes), and a repeater/decoder module 22. The module is shown only symbolically, the actual circuitry being shown in FIGS. 4 and 5. An infrared receiver 24 responds to IR radiation. As will be described, the module controls a respective function if the received code represents the address of the module. The module also repeats the received code by pulsing light emitting diodes D6 and D7. Preferably there are two repeating diodes. At the very least, however, there must be at least one and the angle between the axis of the transmitting diode and the axis of the receiver should be less than 90 degrees.

Figure 5:
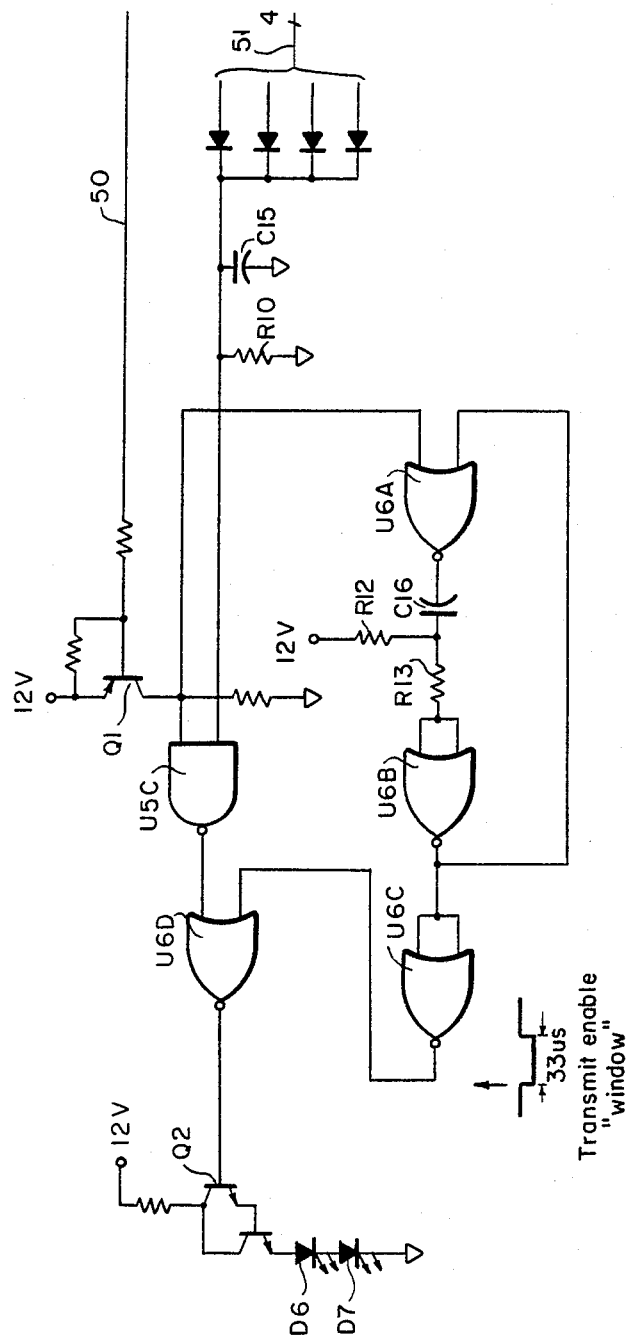
FIG. 5 is a schematic of the optional repeater circuit shown by block 52 in FIG. 4.

The circuitry included in module 22 is shown in FIGS. 4 and 5. Actually FIG. 4 depicts the decoding circuitry, with repeater circuit 52 being shown as optional; there may be some devices which do not repeat the transmission and instead simply check whether the received code is intended for them. For such devices circuit 52 would be omitted. In the case of a module which includes a repeater circuit, reference should be made to FIG. 5 which depicts the repeater schematic. Diodes D6 and D7 shown on FIG. 3 for retransmitting a received code are shown on FIG. 5 as part of the repeater circuit. As for receiver 24 on FIG. 3, it is shown on the schematic of FIG. 4 as including two diodes D1A and D1B.

Although two diodes D1A and D1B are shown for receiving radiation transmitted by the console or the repeater of another remote unit, in some cases it may be necessary to use only one. If the repeater is included in a lamp, it is possible that the lamp shade will reflect light from the bulb to the receiver diodes. This light may be sufficient to saturate the input amplifier. In order that there be some dynamic range, it may be necessary in such a case to remove one of the diodes.

As described above, two important features of the repeater circuit (some of the controlling circuitry for which is included in the schematic of FIG. 4) are that a pulse can be retransmitted for only thirty microseconds after which retransmission is inhibited for an interval during which it is known that the transmitter will not be transmitting another pulse, and retransmission is allowed in the first place only after a valid code has been decoded (retransmission thus beginning with the second of the repetitively transmitted codes in the illustrative embodiment of the invention).

Integrated circuits U1 and U2 are arranged as suggested by the manufacturer. Integrated circuit U2 includes an internal clock which is adjusted to the timing of the received pulses. The received code is linearly amplified by integrated circuit U1, and the amplified signal on pin 9 is fed to integrated circuit U2 which is a decoder. The four-bit output from integrated circuit U2 represents the decoded transmission.

It will be recalled that each transmitted code consists of five bits (32 possible codes). In the illustrative system, there are at most eight remote devices which must be controlled; eight codes are used to toggle respective devices on and off. Another eight are used as a master reset, any one of them turning all eight devices off. The remaining sixteen codes are used for controlling the heating/cooling (HVAC) in the room. (Different coding altogether is required for controlling the TV, and it varies from manufacturer to manufacturer.)

Integrated circuit U1 generates a pulse series at pin 15 which is the same as that on pin 9, except that it is stretched depending on the value of capacitor C13. Although 20-microsecond pulses are transmitted by the console, the received pulses may not be as wide due to interference. What appears on line 50, however, are 20-microsecond pulses.

The four-bit output of decoder U2 is converted by decoder U3 to one of eight outputs. Although sixteen codes are possible, a one-out-of-ten decoder is used because there are fewer than sixteen remote devices. In fact, there are at most eight so that only eight of the decoder outputs are even used. The decoder is a 4028 integrated circuit made by RCA and others.

The eight outputs of decoder U3 (with at most one being energized at any instant of time) are extended to respective inputs of DIP switch SW1. Only one of the switch contacts is closed, the number of the closed contact representing the address of the remote unit. For example, if the fourth contact is closed, then only if the fourth output of U3 is high will a pulse be extended to the inputs of gate U5A. Once a decoded pulse is generated by U3, capacitor C12 charges fast and stays charged long enough to ensure that a high potential is applied to gate U5A for longer than the minimum time interval required to toggle a flip-flop. When the output of this gate goes low it is an indication that a code has been sent to this particular remote unit.

The remote unit of FIG. 4 is shown controlling a lamp. The lamp is turned on when relay K1 is energized by current flowing through triac D5. Flip-flop U4A functions as a toggle switch. The state of the flip-flop changes whenever the output of gate U5B goes high. When the D output of U2 is high, however, the reset input of flip-flop U4A is energized and the flip-flop is reset. The Q output goes low, triac D5 turns off if it was previously on, and the lamp is turned off. The same connection in every remote unit allows all of the remote devices to be turned off simultaneously, simply by having the D bit in the transmitted four-bit code equal to a one. [There are thus eight possible master turn-off codes, each of which turns off all eight remote units.] It is only when the D bit is a zero that the three other bits control the toggling of flip-flop U4A in the addressed device to turn the lamp or other controlled device from on to off, or off to on. The connections to flip-flop U4A are such that the state of the flip-flop toggles whenever it is clocked, a configuration well known in the art.

Before describing how the repeater circuit operates, it should be appreciated that the lamp or whatever other device is controlled by the decoding circuitry of FIG. 4 can also be operated manually. This requires that the output of gate U5B be pulsed high not only when the output of gate U5A goes low, but also when the $\overline{Q}$ output of flip-flop U4B goes low. In order to derive a pulse it is apparent that a momentary switch should suffice. However, the lamps in hotel rooms are almost always provided with rotary switches because hotel managements do not want to risk a lamp being pushed or tipped over when a guest pushes a button, and, unfortunately, rotary momentary switches are hard to come by. For this reason a rotary switch which is on or off must be used to derive a momentary pulse. What is done in the circuit of FIG. 4 is to rely on the contact bounce of the rotary switch; there is contact bounce whether a switch is first opened or closed, and in each case the contact bounce is used to generate a pulse which toggles flip-flop U4A.

When the rotary on/off switch is activated in either direction, the polarity of the signal at the clock input of flip-flop U4B switches back and forth as the contacts bounce. The first positive transition causes the flip-flop to be set because the D input is connected to a positive potential. The $\overline{Q}$ output goes low and gate U5B, which functions as a logical OR, toggles flip-flop U4A. After 150 milliseconds, by which time the contact bounce has ceased, capacitor C17 has charged through resistor R8 from the Q output of the flip-flop sufficiently to reset the flip-flop, returning it to a condition in which it awaits another operation of the rotary switch. Capacitor C17 then discharges through resistor R8 and the Q output of the flip-flop in preparation for the next operation of the switch.

The schematic of the repeater circuit is shown in FIG. 5. As is clear from both of FIGS. 4 and 5, there are two sets of inputs to the repeater circuit. The first is simply a pulse code sequence on conductor 50. The second is a four-bit code from the outputs of decoder U2. When the decoder detects two identical valid codes in succession, it energizes one or more of the four outputs for a minimum of forty milliseconds. (A code sequence requires about forty milliseconds.) As long as one of the outputs is high, the four connected diodes on the right side of FIG. 5 extend a positive potential to capacitor C15. The capacitor charges quickly to force one input of gate U5C high. Capacitor C15 and resistor R10 have a time constant which allows them to enable gate U5C for 100 milliseconds. This means that if a valid code is sensed by U2, gate U5C will be enabled for about 100 milliseconds starting after the first reception of the code. Starting with the subsequent transmission, as the pulses appear on conductor 50, transistor Q1 conducts to energize the second input of gate U5C. Thus, the output of the gate goes low, following the pulses in the second code transmission, only if some valid code was first sensed by U2. During the next 100 milliseconds, at least two more of the repetitive transmissions of the same code will be retransmitted by the repeater to other remote units.

The reason for providing the 100-millisecond timing is as follows. Decoder U2 decodes four bits, providing sixteen codes (only eight of which are actually used, in addition to a master reset). But decoder U2 actually responds to a five-bit code. What it does is to see if the fifth bit is of the proper value; only if it is can one or more of the other four bit outputs go high in accordance with the code represented by the other four bits. There are two kinds of decoders provided by Plessey Semiconductor, each responding to a fifth bit of opposite value. (If there are more than sixteen devices to be controlled, decoders of both types must be used.) The problem is how to get a decoder of one type to control retransmission of a code associated with decoders of the other types, i.e., a code to which the decoder does not even respond. Similarly, an entirely different set of codes may be used to control the television receiver; in such a case, all of the outputs of decoder U2 in FIG. 4 will remain low when HVAC or TV commands are being transmitted, and there will be no way to enable the retransmission.

The solution to this problem is to transmit a "dummy" code whose fifth bit is of the proper polarity to cause decoder U2 to operate. For example, consider that all HVAC commands have a fifth bit of value one. Before a HVAC command is transmitted, a "dummy" code whose fifth bit has a value of zero is first transmitted. The remaining four bits are decoded and one or more of the four outputs of decoder U2 on FIG. 4 go high; they do not control the transmission of a pulse through switch SW1, however, because they may represent a code whose decimal value is greater than eight and for which decoder U3 does not provide an output. But because one or more of the outputs of U2 go high, the 100-millisecond timing circuit is triggered and gate U5C is enabled for subsequent transmissions. The subsequent transmissions by the console are of the HVAC codes which do not result in any of the outputs of U2 going high. Nevertheless, the transmission which is repeated on conductor 50 operates the repeater circuit because gate U5C remains enabled for 100 milliseconds.

The 100-millisecond timer is retriggered every time that a valid code is received. This period of time is longer than the time required to transmit one complete code; the reason for this is that it is desirable to allow multiple transmissions of the same code and this must be accomplished even by a repeater whose U2 decoder responds only to an initial dummy code.

Each pulse on conductor 50 causes the output of U5C to go low and the output of U6D to go high. Transistor Q2 conducts and the pulse is retransmitted by light emitting diodes D6 and D7. The same pulse at the output of transistor Q1 is extended to one input of gate U6A. This gate and gate U6B, together with capacitor C16 and resistors R12 and R13, comprise a 30-microsecond one-shot multivibrator. The output of U6B is normally low, forcing the output of U6C to be high. This output is connected to one input of U6D. Normally both inputs of U6D are high, and its output is low to hold transistor Q2 to off. Each pulse on conductor 50 causes both inputs of U6D to go low; it is now when the output goes high that there is retransmission of the pulse. The pulse on conductor 50 is supposed to be 20 microseconds long, but it may be longer if there is feedback from other repeaters or even the same repeater. The multivibrator remains energized, however, for only 30 microseconds. At the end of this interval, the output of U6B returns to its normal low state and the output of U6C returns to its normal high state. This causes the transmission to cease as the output of U6D goes low. It takes 100 microseconds for the multivibrator to restore. Consequently, even if there is a signal on conductor 50, it cannot be retransmitted during the 100 microseconds that the multivibrator takes to restore. By the time 100 microseconds have gone by, all of the repeaters have stopped retransmitting and none of them exhibit signals on conductor 50. It is only when the console transmits another pulse that it is retransmitted by all of the repeaters.

Although the invention has been described with reference to a particular embodiment, it is to be understood that this embodiment is merely illustrative of the application of the principles of the invention. Numerous modifications may be made therein and other arrangements may be devised without departing from the spirit and scope of the invention.

We claim:

1. An infrared remote control system for allowing a console to control the operations of a plurality of remote devices all situated in the same substantially enclosed space, comprising: a console having at least two simultaneously-operated infrared transmitters whose axes are separated by an angle of at least 90 degrees, means for representing a desired function, and means responsive to operation of said representing means for controlling said at least two infrared transmitters to transmit a respective selected code, said controlling means causing said at least two infrared transmitters to repetitively transmit the same selected code; and a plurality of remote devices all having means for detecting and decoding a received code, at least one of the remote devices including means for recognizing a code and implementing the respective desired function and infrared means for retransmitting the received code, and the remote devices which include retransmitting means further including means for validating the received code and enabling the operation of said retransmitting means only subsequent to prior receipt of a validated code.

2. An infrared remote control system in accordance with claim 1 wherein the validating means in said remote devices which include retransmitting means are operative to validate the received code which corresponds to no desired function for the purpose of enabling the retransmitting means in the same remote device to operate and retransmit subsequent received codes whose respective functions are also unrelated to such remote device.

3. An infrared remote control system in accordance with claim 2 wherein one of said remote devices further includes means responsive to receipt of a respective code for toggling an electrical closure, and means connectable to a manual electrical switch responsive to the contact bounce therein for toggling said electrical closure.

4. An infrared remote control system in accordance with claim 3 wherein said manual electrical switch is a rotary switch.

5. An infrared remote control system in accordance with claim 1 wherein said retransmitting means includes semiconductor means for receiving the code and at least one semiconductor means for transmitting the same code, the receiving and at least one transmitting semiconductor means having axes which are separated by an angle less than 90 degrees.

6. An infrared remote control system in accordance with claim 1 wherein said console has at least four simultaneously-operated infrared transmitters.

7. An infrared remote control system in accordance with claim 1 wherein said console has a sufficient number of simultaneously-operated infrared transmitters to allow the console to swivel at least 45 degrees in either direction without losing control over the plurality of remote devices situated in the same substantially enclosed space.

8. An infrared remote control system in accordance with claim 1 wherein two simultaneously-operated infrared transmitters in said console are aimed respectively, relative to the console and when the console is in its normal orientation, forwardly and at an upward angle toward the vertical wall disposed to the rear of the console.

9. An infrared remote control system in accordance with claim 8 wherein the console includes two additional infrared transmitters both aimed, relative to the console, forwardly and upwardly, but to opposite sides of the console.

10. An infrared remote control system in accordance with claim 1 wherein said console and at least a first one of the remote devices for recognizing a code and implementing the respective function are not in direct line of sight, and at least a second one of the remote devices for retransmitting the received code serves to retransmit the code to said first remote device.

11. An infrared remote control system in accordance with claim 1 wherein each code includes a group of pulses and, in order to prevent feedback oscillations, each remote device which retransmits the received code includes means for gating on its retransmitting means for only a predetermined time interval responsive to receipt of each pulse in the code.

12. An infrared remote control system in accordance with claim 1 wherein one of said remote devices further includes means responsive to receipt of a respective code for toggling an electrical closure, and means connectable to a manual electrical switch responsive to the contact bounce therein for toggling said electrical closure.

13. An infrared remote control system in accordance with claim 12 wherein said manual electrical switch is a rotary switch.

14. An infrared remote control system for allowing a console to control the operations of a plurality of remote devices all situated in the same substantially enclosed space, comprising: a console having at least two simultaneously-operated infrared transmitters whose axes are separated by an angle of at least 90 degrees, means for representing a desired function, and means responsive to operation of said representing means for controlling said at least two infrared transmitters to transmit a respective selected code; and a plurality of remote devices all having means for detecting and decoding a received code, at least one of the remote devices including means for recognizing a code and implementing the respective desired function and at least one of the remote devices including infrared means for retransmitting the received code, and said retransmitting means including semiconductor means for receiving the code and at least one semiconductor means for transmitting the same code, the receiving and at least one transmitting semiconductor means having axes which are separated by an angle less than 90 degrees.

15. An infrared remote control system in accordance with claim 14 wherein said console has at least four simultaneously-operated infrared transmitters.

16. An infrared remote control system in accordance with claim 14 wherein said console has a sufficient number of simultaneously-operated infrared transmitters to allow the console to swivel at least 45 degrees in either direction without losing control over the plurality of remote devices situated in the same substantially enclosed space.

17. An infrared remote control system in accordance with claim 14 wherein two simultaneously-operated infrared transmitters in said console are aimed respectively, relative to the console and when the console is in its normal orientation, forwardly and at an upward angle toward a vertical wall disposed to the rear of the console.

18. An infrared remote control system for allowing a console to control the operations of a plurality of remote devices all situated in the same substantially enclosed space, comprising: a console having at least two simultaneously-operated infrared transmitters whose axes are separated by an angle of at least 90 degrees and two additional infrared transmitters both aimed, relative to the console, forwardly and upwardly, but to opposite sides of the console, means for representing a desired function, and means responsive to operation of said representing means for controlling said at least two and said two additional infrared transmitters to transmit a respective selected code; and a plurality of remote devices all having means for detecting and decoding a received code, at least one of the remote devices including means for recognizing a code and implementing the respective desired function and at least one of the remote devices including infrared means for retransmitting the received code.

19. An infrared remote control system for allowing a console to control the operations of a plurality of remote devices all situated in the same substantially enclosed space, comprising: a console having at least two simultaneously-operated infrared transmitters whose axes are separated by an angle of at least 90 degrees, means for representing a desired function, and means responsive to operation of said representing means for controlling said at least two infrared transmitters to transmit a respective selected code; and a plurality of remote devices all having means for detecting and decoding a received code, at least one of the remote devices including means for recognizing a code and implementing the respective desired function and at least one of the remote devices including infrared means for retransmitting the received code; said console and at least a first one of the remote devices for recognizing a code and implementing the respective function being not in direct line of sight, and at least a second one of the remote devices for retransmitting the received code serving to retransmit the code to said first remote device.

20. An infrared remote control system for allowing a console to control the operations of a plurality of remote devices all situated in the same substantially enclosed space, comprising: a console having at least two simultaneously-operated infrared transmitters whose axes are separated by an angle of at least 90 degrees, means for representing a desired function, and means responsive to operation of said representing means for controlling said at least two infrared transmitters to transmit a respective selected code; and a plurality of remote devices all having means for detecting and decoding a received code, at least one of the remote devices including means for recognizing a code and implementing the respective desired function and at least one of the remote devices including infrared means for retransmitting the received code; each code including a group of pulses, and, in order to prevent feedback oscillations, each remote device which retransmits the received code including means for gating on its retransmitting means for only a predetermined time interval responsive to receipt of each pulse in the code.

21. An infrared remote control system for allowing a console to control the operations of a plurality of remote devices all situated in the same substantially enclosed space, comprising: a console having at least two simultaneously-operated infrared transmitters whose axes are separated by an angle of at least 90 degrees, means for representing a desired function, and means responsive to operation of said representing means for controlling said at least two infrared transmitters to transmit a respective selected code; and a plurality of remote devices all having means for detecting and decoding a received code, at least one of the remote devices including means for recognizing a code and implementing the respective desired function and at least one of the remote devices including infrared means for retransmitting the received code, and one of said remote devices further including means responsive to receipt of a respective code for toggling an electrical closure, and means connectable to a manual electrical switch responsive to the contact bounce therein for toggling said electrical closure.

22. An infrared remote control system in accordance with claim 21 wherein said manual electrical switch is a rotary switch.

23. An infrared remote control system for allowing a console to control the operations of a plurality of remote devices all situated in the same substantially enclosed space, comprising: a console having infrared transmitting means, means for representing a desired function, and means responsive to operation of said representing means for controlling said infrared transmitting means to transmit a respective selected code, said controlling means causing said infrared transmitting means to repetitively transmit the same selected code; and a plurality of remote devices all having means for detecting and decoding a received code, at least one of the remote devices including means for recognizing a code and implementing the respective desired function, at least one of the remote devices including infrared means for retransmitting the received code, and at least one of the remote devices including both recognizing and implementing means, and retransmitting means, and the remote devices which include retransmitting means further including means for validating the received code and enabling the operation of said retransmitting means only subsequent to prior receipt of a validated code.

24. An infrared remote control system for allowing a console to control the operations of a plurality of remote devices all situated in the same substantially enclosed space, comprising: a console having infrared transmitting means, means for representing a desired function, and means responsive to operation of said representing means for controlling said infrared transmitting means to transmit a respective selected code; and a plurality of remote devices all having means for detecting and decoding a received code, at least one of the remote devices including means for recognizing a code and implementing the respective desired function, at least one of the remote devices including infrared means for retransmitting the received code, and at least one of the remote devices including both recongizing and implementing means, and retransmitting means, said retransmitting means including semiconductor means for receiving the code and at least one semiconductor means for transmitting the same code, the receiving and at least one transmitting semiconductor means having axes which are separated by an angle less than 90 degrees.

25. An infrared remote control system for allowing a console to control the operations of a plurality of remote devices all situated in the same substantially enclosed space, comprising: a console having infrared transmitting means, means for representing a desired function, and means responsive to operation of said representing means for controlling said infrared transmitting means to transmit a respective selected code; and a plurality of remote devices all having means for detecting and decoding a received code, at least one of the remote devices including means for recognizing a code and implementing the respective desired function, at least one of the remote devices including infrared means for retransmitting the received code, and at least one of the remote devices including both recognizing and implementing means, and retransmitting means; said console and at least a first one of the remote devices for recognizing a code and implementing the respective function being not in direct line of sight, and at least a second one of the remote devices for retransmitting the received code serving to retransmit the code to said first remote device.

26. An infrared remote control system for allowing a console to control the operations of a plurality of remote devices all situated in the same substantially enclosed space, comprising: a console having infrared transmitting means, means for representing a desired function, and means responsive to operation of said representing means for controlling said infrared transmitting means to transmit a respective selected code; and a plurality of remote devices all having means for detecting and decoding a received code, at least one of the remote devices including means for recognizing a code and implementing the respective desired function, at least one of the remote devices including infrared means for retransmitting the received code, and at least one of the remote devices including both recognizing and implementing means, and retransmitting means; each code including a group of pulses, and, in order to prevent feedback oscillations, each remote device which retransmits the received code includes means for gating on its retransmitting means for only a predetermined time interval responsive to receipt of each pulse in the code.

27. An infrared remote control system for allowing a console to control the operations of a plurality of remote devices all situated in the same substantially enclosed space, comprising: a console having infrared transmitting means, means for representing a desired function, and means responsive to operation of said representing means for controlling said infrared transmitting means to transmit a respective selected code; and a plurality of remote devices including means for recognizing a code and implementing the respective desired function, at least one of the remote devices including infrared means for retransmitting the received code, and at least one of the remote devices including both recognizing and implementing means, and retransmitting means, and one of said remote devices further including means responsive to receipt of a respective code for toggling an electrical closure, and means connectable to a manual electrical switch responsive to the contact bounce therein for toggling said electrical closure.

28. An infrared remote control system in accordance with claim 27 wherein said manual electrical switch is a rotary switch.

29. An infrared remote unit controlled by an infrared transmitter which repetitively transmits a code corresponding to a desired function, comprising: means for detecting and decoding a received code, means for recognizing the code and implementing the corresponding desired function, infrared means for retransmitting the received code, and means for validating the received code and enabling the operation of said retransmitting means only subsequent to prior receipt of a validated code.

30. An infrared remote unit in accordance with claim 29 wherein said retransmitting means includes semiconductor means for receiving the code and at least one semiconductor means for transmitting the same code, the receiving and at least one transmitting semiconductor means having axes which are separated by an angle less than 90 degrees.

31. An infrared remote unit in accordance with claim 30 wherein each code includes a group of pulses and further including means for gating on said retransmitting means for only a predetermined time interval responsive to receipt of each pulse in a received code.

32. An infrared remote unit in accordance with claim 31 further including means responsive to receipt of a respective code for toggling an electrical closure, and means connectable to a manual electrical switch responsive to the contact bounce therein for toggling said electrical closure.

33. An infrared remote unit in accordance with claim 32 wherein said manual electrical switch is a rotary switch.

34. An infrared remote unit in accordance with claim 29 wherein each code includes a group of pulses and further including means for gating on said retransmitting means for only a predetermined time interval responsive to receipt of each pulse in a received code.

35. An infrared remote unit in accordance with claim 29 further including means responsive to receipt of a respective code for toggling an electrical closure, and means connectable to a manual electrical switch responsive to the contact bounce therein for toggling said electrical closure.

36. An infrared remote unit in accordance with claim 35 wherein said manual electrical switch is a rotary switch.

37. An infrared remote unit in accordance with claim 28 further including means responsive to receipt of a respective code for toggling an electrical closure, and means connectable to a manual electrical switch responsive to the contact bounce therein for toggling said electrical closure.

38. An infrared remote unit in accordance with claim 37 wherein said manual electrical switch is a rotary switch.

39. An infrared remote control system for allowing a console to control the operations of a plurality of remote devices all situated in the same substantially enclosed space, comprising: a console having infrared transmitter means for transmitting infrared radiation in a plurality of directions, means for representing a desired function, and means responsive to operation of said representing means for controlling said infrared transmitter means to transmit a respective selected code in each direction; and a plurality of remote devices all having means for detecting and decoding a received code, at least one of the remote devices including means for recognizing a received code and implementing the respective desired function, and at least one of the remote devices including infrared means for retransmitting a received code, said at least one remote device which includes retransmitting means further including means for preventing feedback oscillations which would otherwise arise due to the associated detecting and decoding means responding to the reception of infrared radiation from a plurality of sources.

40. An infrared remote control system in accordance with claim 39 wherein said controlling means causes said infrared transmitter means to repetitively transmit the same selected code in each direction, and said means for preventing feedback oscillations, in said at least one remote device which includes retransmitting means, comprises means for validating the received code and enabling the operation of the associated retransmitting means only subsequent to prior receipt of a validated code.

41. An infrared remote control system in accordance with claim 40 wherein said validating means in said at least one remote device which includes retransmitting means is operative to validate a received code which corresponds to no desired function for the purpose of enabling the retransmitting means in the same remote device to operate and retransmit subsequent received codes whose respective functions are also unrelated to such remote device.

42. An infrared remote control system in accordance with claim 41 wherein said at least one remote device which includes means for implementing a function further includes means responsive to receipt of a respective code for toggling an electrical closure, and means connectable to a manual electrical switch responsive to the contact bounce therein for toggling said electrical closure.

43. An infrared remote control system in accordance with claim 42 wherein said manual electrical switch is a rotary switch.

44. An infrared remote control system in accordance with claim 40 wherein said retransmitting means includes first semiconductor means for receiving the code and second semiconductor means for transmitting the same code, said receiving first semiconductor means and said transmitting second semiconductor means having respective reception and transmission axes which are separated by an angle such that the retransmission of the received code away from said second semiconductor means is in a direction other than the direction of transmission of the received code toward said first semiconductor means.

45. An infrared remote control system in accordance with claim 44 wherein said angle between said reception and transmission axes of said first and second semiconductor means is less than 90 degrees.

46. An infrared remote control system in accordance with claim 40 wherein said infrared transmitter means of said console comprise a sufficient number of simultaneously-operated infrared transmitters to allow the console to swivel at least 45 degrees in either direction without losing control over the plurality of remote devices situated in the same substantially enclosed space.

47. An infrared remote control system in accordance with claim 46 wherein said console has at least four simultaneously-operated infrared transmitters.

48. An infrared remote control system in accordance with claim 40 wherein said infrared transmitter means of said console comprise two simultaneously-operated infrared transmitters which are aimed, respectively, relative to the console and when the console is in its normal orientation, forwardly and at an upward angle toward a vertical wall disposed to the rear of the console.

49. An infrared remote control system in accordance with 48 wherein said infrared transmitter means of said console further comprise two additional infrared transmitters both aimed, relative to the console, forwardly and upwardly, but to opposite sides of the console.

50. An infrared remote control system in accordance with claim 40 wherein said infrared transmitter means of said console and at least a first remote device of those which include means for recognizing a code and implementing the respective function are not in direct line of sight with each other, and at least a second remote device of those which include means for retransmitting a received code serves to retransmit the code to said first remote device.

51. An infrared remote control system in accordance with claim 40 wherein each code includes a group of pulses, and said means for preventing feedback oscillations comprise, in said at least one remote device which includes means for retransmitting a received code, means for gating on its associated retransmitting means for only a predetermined time interval responsive to receipt of each pulse in the code.

52. An infrared remote control system in accordance with claim 40 wherein said at least one remote device which includes means for implementing a function further includes means responsive to receipt of a respective code for toggling an electrical closure, and means connectable to a manual electrical switch responsive to the contact bounce therein for toggling said electrical closure.

53. An infrared remote control system in accordance with claim 52 wherein said manual electrical switch is a rotary switch.

54. An infrared remote control system in accordance with claim 39 wherein said retransmitting means includes first semiconductor means for receiving a code and second semiconductor means for transmitting the same code, said receiving first semiconductor means and said retransmitting second semiconductor means having respective reception and transmission axes which are separated by an angle such that the retransmission of the received code away from said second semiconductor means is in a direction other than the direction of the preceding transmission of the received code toward said first semiconductor means.

55. An infrared remote control system in accordance with claim 39 wherein said infrared transmitter means of said console comprise a sufficient number of simultaneously-operated infrared transmitters to allow the console to swivel at least 45 degrees in either direction without losing control over the plurality of remote devices situated in the same substantially enclosed space.

56. An infrared remote control system in accordance with claim 39 wherein said infrared transmitter means of said console comprise two simultaneously-operated infrared transmitters which are aimed, respectively, relative to the console and when the console is in its normal orientation, forwardly and at an upward angle toward a vertical wall disposed to the rear of the console.

57. An infrared remote control system in accordance with claim 56 wherein said infrared transmitter means of said console further comprise two additional infrared transmitters both aimed, relative to the console, forwardly and upwardly, but to opposite sides of the console.

58. An infrared remote control system in accordance with claim 39 wherein said infrared transmitter means of said console and at least a first remote device of those which include means for recognizing a code and implementing the respective function are not in direct line of sight with each other, and at least a second remote device of those which include means for retransmitting a received code serves to retransmit the code to said first remote device.

59. An infrared remote control system in accordance with claim 39 wherein each code includes a group of pulses, and said means for preventing feedback oscillations comprise, in said at least one remote device which includes means for retransmitting means for only a predetermined time interval responsive to receipt of each pulse in the code.

60. An infrared remote control system in accordance with claim 39 wherein said at least one remote device which includes means for implementing a function further includes means responsive to receipt of a respective code for toggling an electrical closure, and means connectable to a manual electrical switch responsive to the contact bounce therein for toggling said electrical closure.

61. An infrared remote control system is accordance with claim 60 wherein said manual electrical switch is a rotary switch.

62. An infrared remote control system for allowing a console to control the operations of a plurality of remote devices all situated in the same substantially enclosed space, comprising: a console having infrared transmitting means, means for representing a desired function, and means responsive to operation of said representing means for controlling said infrared transmitting means to transmit a respective selected code; and a plurality of remote devices all having means for detecting and decoding a received code, at least one of the remote devices including means for recognizing a code and implementing the respective desired function, and at least one of the remote devices including infrared means for retransmitting a received code, said at least one remote device which includes retransmitting means further including means for preventing interference with the reception or the retransmission or both the reception and the retransmission of a selected code.

63. An infrared remote control system in accordance with claim 62 wherein said controlling means causes said infrared transmitting means to repetitively transmit the same selected code, and said means for preventing interference which is in the form of random noise-generated low-level signals comprises, in said at least one remote device which includes retransmitting means, means for validating the received code and enabling the operation of said transmitting means only subsequent to prior receipt of a validated code.

64. An infrared remote control system in accordance with claim 62 wherein said controlling means causes said infrared transmitting means to include in each code a group of pulses, and said means for preventing interference which is in the form of feedback oscillations comprises, in said at least one remote device which includes retransmitting means, means for gating on its retransmitting means for only a predetermined time interval responsive to receipt of each pulse in the code.

65. An infrared remote control system in accordance with claim 62 wherein said retransmitting means includes first semiconductor means for receiving a code and second semiconductor means for transmitting the same code, said receiving first semiconductor means and said transmitting second semiconductor means having respective reception and transmission axes which are separated by an angle such that the retransmission of the received code away from said second semiconductor means is in a direction other than the direction of transmission of the received code toward said first semiconductor means.

66. An infrared remote control system in accordance with claim 65 wherein said angle between said reception and transmission axes of said first and second semiconductor means is less than 90 degrees.

67. An infrared remote control system in accordance with claim 62 wherein said infrared transmitting means of said console and at least a first remote device of those which include means for recognizing a code and implementing the respective function are not in direct line of sight with each other, and at least a second remote device of those which include means for retransmitting a received code serves to retransmit the code to said first remote device.

68. An infrared remote control system in accordance with claim 62 wherein at least said one remote device which includes means for implementing a function further includes means responsive to receipt of a respective code for toggling an electrical closure, and means connectable to a manual electrical switch responsive to the contact bounce there in for toggling said electrical closure.

69. An infrared remote control system in accordance with claim 68 wherein said manual electrical switch is a rotary switch.

* * * * *